Sept. 27, 1960 F. A. HILL ET AL 2,954,484

DIRECT COUPLED TRANSISTOR FLIP-FLOP

Filed Feb. 13, 1956

INVENTORS
FRANK A. HILL
A. J. PANKRATZ

BY Theodore H. Lassagne

ATTORNEY

United States Patent Office 2,954,484
Patented Sept. 27, 1960

2,954,484

DIRECT COUPLED TRANSISTOR FLIP-FLOP

Frank A. Hill, Van Nuys, and A. J. Pankratz, Glendale, Calif., assignors to General Precision, Inc., a corporation of Delaware Filed Feb. 13, 1956, Ser. No. 565,093

4 Claims. (Cl. 307—88.5)

This invention relates to flip-flops and more particularly to flip-flops using semi-conductors such as transistors. The invention is especially concerned with flip-flops which use a pair of transistors directly coupled to each other.

Semi-conductors such as transistors have been widely used in recent years in various types of electronic circuits. The semi-conductors are used in these circuits since they have certain important advantages. One advantage results from the small size of the transistors in comparison to vacuum tubes. Other advantages result from the low power losses in the transistors and from their stable operating characteristics over long periods of time.

In certain circuits, transistors have been directly coupled to one another. Transistors are directly coupled to one another when elements in one transistor are directly coupled to elements in a second transistor. For example, a flip-flop has been built in which the collector of a first transistor is connected to the base of a second transistor and the collector of the second transistor is connected to the base of the first transistor. This type of flip-flop is advantageous in that it requires only a minimum number of components by eliminating any impedances between the elements of the two transistors. Since such impedances are eliminated, power losses are minimized and input impedances from one stage to the next are reduced.

This invention provides a flip-flop formed from a pair of directly coupled transistors and including components for improving the performance characteristics of the flip-flop. The transistors in the flip-flop are directly coupled by connecting the collector of each transistor to the base of the other transistor. A resistance is connected between the emitter of each transistor and ground. By including the resistance, the amplitudes of the input signals for driving the transistors can be reduced. Furthermore output signals of considerably increased intensity can be obtained from the flip-flop and the maximum frequency of response of the flip-flop can be materially increased.

Figure 1:
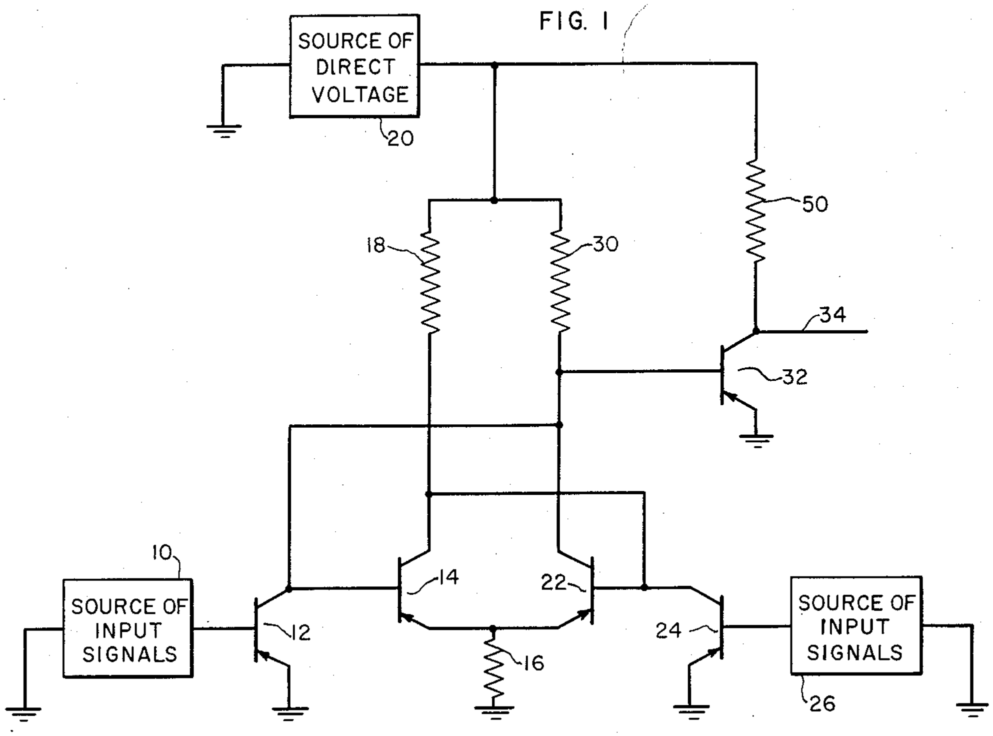
Figure 1 is a circuit diagram, partly in block form, illustrating a flip-flop constituting one embodiment of the invention.

In the embodiment of the invention shown in Figure 1, a source 10 of input signals is connected to an element equivalent to or corresponding to the base of a semi-conductor such as a transistor 12. Although the signal source 10 is shown in block form in Figure 1 it should be appreciated that a considerable number of different sources can be used. For example, any source may be used in which discrete pulses are produced at intermittent or periodic intervals of time. These sources may include such circuits as relaxation oscillators, clock generators or any of the stages in digital computers and data processing systems for producing output pulses.

The transistor 12 may be provided with elements equivalent to or corresponding to an emitter, a base and a collector. The transistor 12 is preferably of the PNP type in which excesses of positive charges or "holes" are produced in the emitter and collector and in which an excess of electrons is produced in the base. The transistor 12 is also preferably of the type in which the base is formed from germanium and is provided with a pair of parallel flat faces separated from each other by a relatively thin width. A foreign substance such as indium or a mixture of indium and gallium is coated on the parallel faces of the germanium base. The coating on one face is adapted to serve as the emitter of the transistor and the coating on the other face is adapted to serve as the collector of the transistor.

Transistors found useful as the transistor 12 include Type "SB–100" manufactured by the Philco Corporation, Type "RR–115" manufactured by Radio Receptor Company, Types "OC–32" and "OC–34" manufactured by Transistor Products Company and Type "ZJ–11" manufactured by the General Electric Corporation. The type "SB–100" manufactured by Philco is a surface barrier type of transistor.

The emitter of the transistor 12 may be grounded as shown in the drawings or it may be connected to the collector of one or more other transistors which provide a path to ground. The collector of the transistor 12 is connected to the base of a transistor 14 having properties corresponding to those described above for the transistor 12. The emitter of the transistor 14 is connected to one terminal of a resistance 16 having a suitable value such as in the range of 2 to 200 ohms. The other terminal of the resistance 16 is connected to a common reference potential such as ground.

For purposes of terminology in the claims, the bases of the transistors 22 and 14 may be considered as input electrodes, the collectors as output electrodes and the emitters as common electrodes since the emitters are connected directly to each other. Also, for purposes of terminology in the claims, the term "directly connected" with respect to the bases and collectors of the transistors 22 and 14 is intended to indicate that the collector of each transistor has a common connection with the base of the other transistor such that there is no impedance between the collector of each transistor and the base of the other transistor.

A resistance 18 having a suitable value such as in the range of 10 to 10,000 ohms is connected between the collector of the transistor 14 and a terminal of a source 20 for producing a suitable negative voltage such as approximately −1.5 volts. The collector of the transistor 14 is connected to the base of a transistor 22 having properties corresponding to those described above for the transistor 12. A connection is made from the base of the transistor 22 to the collector of a transistor 24 having properties similar to those described above for the transistor 12. The emitter of the transistor 24 is grounded and the base of the transistor is connected to the output terminal of a source 26 of input signals. The source 26 may have properties corresponding to those of source 10.

The collector of the transistor 22 has a common connection with one terminal of a resistance 30 having a value corresponding to that of the resistance 18. The other terminal of the resistance 30 is adapted to receive negative voltage from the same terminal of the source 20 as that applying the negative potential to the resistance 18. In addition to being connected to the resistance 30, the collector of the transistor 22 is connected to the base of a transistor 32 having properties similar to those described above for the transistor 12. The emitter of the transistor 32 is grounded and the collector is connected to an output line 34.

Figure 2:
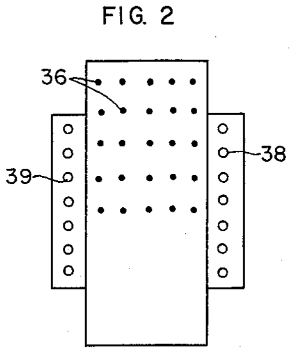
Figure 2 is a diagram somewhat schematically illustrating the operation of transistors included in the flip-flop shown in Figure 1.

Since the transistor 12 is preferably of the PNP type, excesses of positive charges or "holes" are provided in the emitter and collector of the transistor and excesses of electrons are provided in the base. This may be seen in Figure 2 where the excesses of electrons in the base are represented by dots 36 and the excesses of positive charges in the emitter and collector are respectively represented by hollow circles 38 and 39. Because of the difference in charges in the emitter and base of the transistor 12, the holes in the emitter of the transistor 12 are attracted toward the base when a negative voltage of a sufficient amplitude is applied on the base relative to the potential on the emitter.

The holes continue their movement through the base of the transistor 12 to the collector of the transistor when the voltage on the base is sufficiently negative with respect to the voltage on the emitter. The reason for this is that the holes have considerable energy imparted to them during their movement from the emitter toward the base of the transistor 12. This is especially true when a negative voltage is also applied to the collector of the transistor with respect to the potential on the emitter since the negative voltage on the collector operates to attract the holes.

Current normally does not flow through the transistor 12 since the emitter of the transistor is grounded and a negative voltage is normally not applied to the base. Upon the production of a negative signal by the source 10, the potential on the base of the transistor 12 becomes negative with respect to the potential on the emitter of the transistor. This causes current to flow between the emitter and the collector of the transistor 12 in a manner similar to that described in the previous paragraph. The current flows through a circuit including the emitter and collector of the transistor 12, the resistance 30 and the voltage source 20. The flow of current between the emitter and the collector of the transistor 12 causes a potential approaching ground to be produced on the collector of the transistor. This ground voltage is introduced to the base of the transistor 14.

The ground voltage introduced to the base of the transistor 14 makes the transistor non-conductive since no attractive force is exerted to produce a flow of holes from the emitter toward the base and the collector of the transistor. By making the transistor 14 non-conductive, any flow of current through a circuit including the resistance 16, the transistor 14, the resistance 18 and the voltage source 20 is interrupted. Because of the interruption in the flow of current through the resistance 18, no voltage drop is obtained across the resistance. This causes a negative voltage to be produced on the collector of the transistor 14. This negative voltage is introduced to the base of the transistor 22.

Since a negative voltage is introduced to the base of the emitter 22 relative to the potential approaching ground on the emitter of the transistor, the base acts to attract holes from the emitter of the transistor. This causes current to flow through a circuit including the resistance 16, the emitter and collector of the transistor 22, the resistance 30 and the voltage source 20. Because of the flow of current through the transistor 22 and the resistance 30, a voltage drop is produced across the resistance. This causes the voltage on the collector of the transistor 22 to approach the ground potential on the emitter of the transistor.

The ground potential on the collector of the transistor 22 is introduced to the base of the transistor 14 to produce a further action in cutting off the flow of current through the transistor 14. In this way, the transistor 22 acts to maintain the transistor 14 cut off and the transistor 14 in turn acts to maintain the transistor 22 fully conductive. The transistor 22 remains conductive and the transistor 14 remains non-conductive even after the signal from the source 10 has passed.

The flow of current through the transistor 22 and the non-conductive state of the transistor 14 continue until the introduction of a negative signal from the source 26. The signal from the source 26 causes the voltage on the base of the transistor 24 to become negative with respect to the ground potential on the emitter of the transistor. This voltage relationship between the base and the emitter of the transistor 24 causes the transistor to become conductive and produces a flow of current through a circuit including the transistor 24, the resistance 18 and the voltage source 20. The flow of current through the transistor 24 acts to produce a potential approaching ground on the collector of the transistor.

The ground potential produced on the collector of the transistor 24 is introduced to the base of the transistor 22 to cut off any flow of current through the transistor 22. By cutting off the transistor 22, current is prevented from flowing through a circuit including the resistance 16, the transistor 22, the resistance 30 and the voltage source 20. Since current cannot flow through the resistance 30, no voltage drop is produced across the resistance. This causes the collector of the transistor 22 to have a negative voltage. The negative voltage on the collector of the transistor 22 is introduced to the base of the transistor 14 to produce a flow of current through the transistor 14.

When current flows through the transistor 14, the voltage on the collector of the transistor approaches a ground potential. The ground potential on the collector of the transistor 14 is introduced to the base of the transistor 22 to cut off any flow of current through the transistor 22. In this way, the transistor 14 becomes conductive and the transistor 22 becomes cut off upon the introduction of a signal from the source 26. This relationship continues even after the signal from the source 26 has passed.

The flip-flop described above and shown in Figure 1 has certain important advantages. Since the flip-flop uses transistors, it can be packaged in a relatively small volume. Furthermore, the dissipation of power in the flip-flop is relatively low because of the operating characteristics of transistors. These advantages are enhanced because of the direct coupling of the transistors 14 and 12. By directly coupling the transistors 14 and 12, any requirement for connecting impedances between the transistors is eliminated. In this way, any space requirements for such impedances and any dissipation of heat in the impedances are avoided.

The flip-flop constituting this invention also has other advantages. These result from the inclusion of the resistance 16 in the flip-flop. As has been described previsuoly, current always flows through the resistance 16 since either the transistor 14 or the transistor 22 is conductive at all times. The current flows through the resistance 16 in a direction to produce a negative potential on the ungrounded terminal of the resistance. This potential is in the order of 20 millivolts for the different parameters described above.

Since a negative voltage is continuously produced on the ungrounded terminal of the resistance 16, negative voltages are continuously applied to the emitters of the transistors 14 and 22. For this reason, the transistors 14 and 22 become fully conductive when the bases of the transistors have a negative voltage greater in magnitude by a particular value than the potentials on the emitters of the transistors. Because of this, the bases of the transistors 14 and 22 can be more negative to make the transistors conductive than they would have to be if the emitters were at ground potential.

As previously described, the potentials produced on the collectors of the transistors 12 and 24 are dependent upon the flow of current through the transistors. This results from the fact that the impedance of each of the transistors 12 and 24 decreases as the current through the transistor increases. The impedance of the transistors 12 and 24 decreases in a non-linear relationship with increases in current such that the impedance decreases at a faster rate than the increase in current. For this reason, a negative voltage of significant amplitude is produced on the collectors of the transistors 12 and 24 when the current through the transistors is relatively low. The amplitude of the voltages on the collectors of the transistors 12 and 24 decreases toward ground as the amplitude of the current flowing through the transistors increases.

It has been developed in the previous paragraphs that the potential on the bases of the transistors 14 and 22 can be more negative with the inclusion of the resistance 16 than without the inclusion of the resistance in order to make the transistors fully conductive. The potentials on the bases of the transistors 14 and 22 respectively correspond to the potentials on the collectors of the transistors 12 and 24. Because of this, the magnitudes of the negative potentials on the bases of the transistors 14 and 22 can be respectively increased by producing a decrease in the flow of current through the transistors 12 and 24. Since the amplitudes of the currents through the transistors 12 and 24 can be decreased, the amplitude of the negative signals introduced to the transistors can be decreased. In this way, the amplitude of the signals from the sources 10 and 26 does not have to be as great when the resistance 16 is included as when the resistance 16 is not included.

Further advantages result from obtaining a decrease in the flow of current through the input transistors 12 and 24. One advantage results from the fact that the ratio of the current through the transistors 12 and 24 to the current from the sources 10 and 26 increases with decreases in the flow of current through the transistors. This increase in the current ratios allows the current from th esources 10 and 26 to be even less than might be otherwise expected. In this way, the amplitudes of the triggering signals from the sources 10 and 26 can be less than might otherwise be expected.

Still another advantage is obtained from the decrease in the flow of current through the transistors 12 and 24. By decreasing the flow of current through the transistors 12 and 24, a decrease is obtained in the time required for the transistors to change between states of conductivity and non-conductivity. This in turn produces an increase in the frequency at which signals can be alternately introduced to the flip-flop from the sources 10 and 26. Frequency increases as high as 20% or even higher have been obtained by including the resistance 16. Such increases in the frequency response of the flip-flop may be important in such applications as the generation of clock signals in digital computers and data processing systems.

By including the resistance 16, advantages are gained not only at the input side but also at the output side. This results from the fact that the potential on the collector of the transistor 22 is more negative when the resistance 16 is included than when the resistance is not included. The amplitude of the negative potential on the collector of the transistor 22 is increased by the inclusion of the resistance 16 when current is flowing through the transistor as well as when current is not flowing through the transistor.

Since the magnitude of the negative potential produced on the collector of the transistor 22 becomes increased by including the resistance 16, a negative potential of increased magnitude is introduced to the base of the transistor 32. This causes the voltage difference between the base and the emitter of the transistor 32 to be increased since the emitter of the transistor is grounded. By increasing the voltage difference between the base and the emitter of the transistor 32, an increased flow of current is obtained through the transistor.

Figure 3:
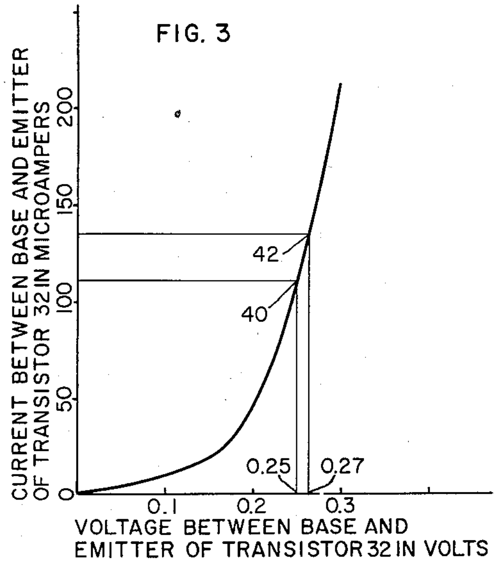
Figure 3 is a curve illustrating the operation of one of the transistors included in the embodiment shown in Figure 1.

Figure 3 shows a graph illustrating certain operating characteristics of transistors corresponding to the transistor 32. In Figure 3, the voltage applied between the base and the emitter of the transistor 32 is plotted along the horizontal axis. The current in microamperes flowing between the base and the emitter of the transistor 32 is plotted along the vertical axis for the different voltages plotted along the horizontal axis.

As will be seen in Figure 3, slight increases in the voltage between the base and emitter of the transistor 32 produce considerable increases in the current flowing between the base and the emitter of the transistor. This is especially true when a relatively large current is already flowing through the transistor 32. For example the voltage applied to the base of the transistor 32 may cause a current having an amplitude illustrated at 40 in Figure 3 to flow through the transistor 32 when the resistance 16 is not included. The current flowing through the transistor 32 may increase to an amplitude indicated at 42 in Figure 3 when the resistance 16 is included. This current flows through the output line 34 to successive stages.

As will be seen in Figure 3, an increase in current from approximately 110 to approximately 135 microamperes is obtained when the negative potential on the base of the transistor is increased from approximately 0.25 volt to approximately 0.27 volt. This corresponds to an increase in current of almost 25% for an increase in voltage of less than 10%. Since an increase in current in the order of approximately 25% is obtained, an increased voltage drop is obtained across a resistance 50 connected to the collector of the transistor 32. This causes the voltage on the collector of the transistor 32 to be driven closer to ground such that a cut-off signal of increased effectiveness is applied from the collector of the transistor to successive stages such as flip-flop stages.

There is thus provided a circuit which uses a pair of transistors on a directly coupled basis to perform the functions of a flip-flop. The flip-flop has certain advantages such as small size, low cost and low power consumption by using a pair of directly coupled transistors. Certain advantages such as efficiency in operation are considerably enhanced by connecting a resistance to the emitters of the transistors. The increased efficiency in operation is obtained both at the input and output sides of the flip-flop. Other advantages such as an increase in the range of frequency response are also obtained by the inclusion of the resistance.

We claim:

1. In combination in bistable circuitry, a first semi-conductor having a base, an emitter and a collector, a second semi-conductor having a base, an emitter and a collector, the base of each semi-conductor being directly connected to the collector of the other semi-conductor, means for providing a direct voltage, first and second resistances each connected between the voltage means and the collector of the different one of the semi-conductors to control the voltage on the collector of the semi-conductor and the voltage on the base of the other semi-conductor for a flow of current through only one of the semi-conductors at any one time, individual means for introducing signals to the bases of the first and second semi-conductors to control which of the semi-conductors is conductive at any one time and to provide for the production of output pulses from the semi-conductors, means including a third semi-conductor having a base, emitter and collector, the emitter of the third semi-conductor being connected to a reference potential and the base of the third semi-conductor being connected to the collector of the second semi-conductor to provide output pulses in accordance with the pulses produced in the second semi-conductor, and a common resistance connected between the emitters of the first and second semi-conductors and the reference potential to minimize the signals required to drive the first and second semi-conductors and to obtain an increased output from the third semi-conductor.

2. In combination in bistable circuitry, a first semi-conductor having a base, an emitter and a collector, a second semi-conductor having a base, an emitter and a collector, the base of each semi-conductor being directly connected to the collector of the other semi-conductor, means for providing a direct voltage, a first resistance connected between the voltage means and the collector of the first semi-conductor to control the voltage applied to the collector, a second resistance connected between the voltage means and the collector of the second semi-conductor to control the voltage applied to the collector, a third semi-conductor having a base, an emitter and a collector, the emitter of the third semi-conductor being connected to a reference potential, the base of the third semi-conductor being connected directly to the collector of the second semi-conductor to produce a flow of current through the third semi-conductor in accordance with the voltage on the collector of the second semi-conductor, individual means for applying signals to the bases of the first and second semi-conductors to control which of the semi-conductors is conductive at any instant, and a common resistance connected between the emitters of the first and second semi-conductors and the reference potential to limit the amplitude of the input signals necessary for changing the state of conductivity of the semi-conductors and to increase the output from the third semi-conductors.

3. In combination in bistable circuitry, first and second semi-conductors each having an emitter, a collector and a base, the collector of each semi-conductor being directly connected to the base of the other semi-conductor for a flow of current through only one of the semi-conductors at any one time, a resistance connected at one end to the emitters of the first and second semi-conductors and at the other end to a reference potential to limit the amplitude of the input signals required to drive the semi-conductors, a source of direct voltage, the collectors of the first and second semi-conductors being coupled to the voltage source to receive a direct voltage from the source, third and fourth semi-conductors each having an emitter, a collector and a base, the emitters of the third and fourth semi-conductors being connected to the reference potential, first and second sources of input signals, the bases of the third and fourth semi-conductors being respectively connected to the first and second sources of input signals to control the conductivity of these semi-conductors in accordance with the introduction of signals from the first and second signal sources, and the collectors of the third and fourth semi-conductors being respectively connected to the bases of the first and second semi-conductors to obtain a flow of current through a particular one of the first and second semi-conductors in accordance with the state of conductivity of the third and fourth semi-conductors, and means connected to the collector of the second semi-conductor to produce an output voltage in accordance with the potential on the collector.

4. In combination in bistable circuitry, first and second semi-conductors each having a base, an emitter and a collector, the collector of each semi-conductor being directly connected to the base of the other semi-conductor, a source of direct voltage, first and second resistances each being connected between the source of direct voltage and the collector of a different one of the semi-conductors, a third resistance connected between the emitters of the first and second semi-conductors and a reference potential, first and second sources of input signals, third and fourth semi-conductors each having a base, an emitter and a collector, the bases of the third and fourth semi-conductors being respectively connected to the first and second signal sources to receive the input signals from the sources, the emitters of the third and fourth semi-conductors being connected to the reference potential, the collectors of the third and fourth semi-conductors being respectively connected to the bases of the first and second semi-conductors, a fifth semi-conductor having a base, an emitter and a collector, the emitter of the fifth semi-conductor being connected to the reference potential and the base of the fifth semi-conductor being connected to the collector of the second semi-conductor, and a third resistance connected between the source of direct voltage and the collector of the fifth semi-conductor.

References Cited in the file of this patent

UNITED STATES PATENTS

| | | |
|---|---|---|
| 2,569,345 | Shea | Sept. 25, 1951 |
| 2,622,212 | Anderson | Dec. 16, 1952 |
| 2,641,717 | Toth | June 9, 1953 |
| 2,778,978 | Drew | June 22, 1957 |
| 2,831,127 | Braicks | Apr. 15, 1958 |

OTHER REFERENCES

Beter et al.: "Directly Coupled Transistor Circuits," Electronics, June 1955, pp. 132 to 136.

Turner: "Transistor Theory and Practice," chapt. 8, p. 89 et seq., Gernsback Publications, New York, April 1954.